(12) United States Patent
Ota et al.

(10) Patent No.: US 9,111,965 B2
(45) Date of Patent: Aug. 18, 2015

(54) SEMICONDUCTOR DEVICE AND METHOD OF MANUFACTURING THE SAME

(71) Applicant: KABUSHIKI KAISHA TOSHIBA, Tokyo (JP)

(72) Inventors: Kensuke Ota, Fujisawa (JP); Masumi Saitoh, Yokohama (JP); Toshinori Numata, Leuven (BE); Chika Tanaka, Yokohama (JP); Satoshi Inada, Seoul (KR)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/084,128

(22) Filed: Nov. 19, 2013

(65) Prior Publication Data

US 2014/0138690 A1    May 22, 2014

(30) Foreign Application Priority Data

Nov. 21, 2012  (JP) .................................. 2012-255444

(51) Int. Cl.
*H01L 29/66* (2006.01)
*H01L 29/792* (2006.01)

(52) U.S. Cl.
CPC ........ *H01L 29/66833* (2013.01); *H01L 29/792* (2013.01)

(58) Field of Classification Search
CPC ............................. H01L 29/66; H01L 28/792
See application file for complete search history.

(56) References Cited

U.S. PATENT DOCUMENTS

| 5,812,450 A | 9/1998 | Sansbury et al. |
| 6,002,610 A | 12/1999 | Cong et al. |
| 6,207,985 B1 * | 3/2001 | Walker .......................... 257/296 |
| 7,554,485 B2 | 6/2009 | Jordan |
| 7,554,854 B2 | 6/2009 | Osame et al. |
| 7,999,303 B2 | 8/2011 | Kikuchi et al. |
| 2007/0230254 A1 * | 10/2007 | Osame et al. ............ 365/185.29 |
| 2009/0242958 A1 * | 10/2009 | Kikuchi et al. ............... 257/319 |

(Continued)

FOREIGN PATENT DOCUMENTS

| JP | 2007-294082 | 11/2007 |
| JP | 2009-245958 | 10/2009 |
| WO | WO 2009/096083 A1 | 8/2009 |

OTHER PUBLICATIONS

Notification of Reason for Rejection issued by the Japanese Patent Office on Feb. 28, 2014, for Japanese Patent Application No. 2012-255444, and English-language translation thereof.

*Primary Examiner* — Minh-Loan Tran
*Assistant Examiner* — Fazli Erdem
(74) *Attorney, Agent, or Firm* — Finnegan, Henderson, Farabow, Garrett & Dunner, L.L.P.

(57) ABSTRACT

A semiconductor device according to an embodiment includes: first and second semiconductor regions each having a protruded shape provided on a substrate, the first semiconductor region including a first source, a first drain, and a first channel provided between the first source and the first drain and extending in a first direction from the first source to the first drain, the first channel having a first width in a second direction perpendicular to the first direction, and the second semiconductor region including a second source, a second drain, and a second channel provided between the second source and the second drain and extending in a third direction from the second source to the second drain, the second channel having a second width in a fourth direction perpendicular to the third direction that is wider than the first width of the first channel.

13 Claims, 13 Drawing Sheets

(56) References Cited

U.S. PATENT DOCUMENTS

2010/0311220 A1\* 12/2010 Matsuo et al. ............... 438/423
2012/0122310 A1\* 5/2012 Nakayama .................... 438/593
2014/0131811 A1\* 5/2014 Saitoh et al. .................. 257/392

\* cited by examiner

US 9,111,965 B2

SEMICONDUCTOR DEVICE AND METHOD OF MANUFACTURING THE SAME

CROSS REFERENCE TO RELATED APPLICATIONS

This application is based upon and claims the benefit of priority from prior Japanese Patent Application No. 2012-255444 filed on Nov. 21, 2012 in Japan, the entire contents of which are incorporated herein by reference.

FIELD

Embodiments described herein relate generally to a semiconductor device and a method of manufacturing the same.

BACKGROUND

A programmable logic switch controls turning on and off of a logic switch (such as a transistor) in accordance with data stored in a memory. The programmable logic switch is generally used in field programmable gate arrays (FPGAs) that require reconfiguration of logical operation circuits and wiring boards. The programmable logic switch used in an FPGA includes a nonvolatile memory such as an SRAM. Therefore, the data stored in the memory is erased when the power is turned off. This results in a problem in that when the power is turned on again, the data needs to be read again from a separate memory region. Another problem is that since a typical SRAM includes six transistors, an FPGA including many SRAMs occupies a large chip area.

Using a nonvolatile flash memory as the memory of a programmable logic switch is a known method. If a flash memory transistor, for example, is used, the data is saved by the charge held in the flash memory transistor. Accordingly, when the power is turned on again, it is not necessary to read the data again from a separate memory region.

However, the gate stack structure of a nonvolatile memory transistor differs from that of a switching transistor. Accordingly, they should be formed separately. This leads to problems of increased number of processes and increased costs caused by the increased processes.

Furthermore, if a transistor having a wider channel region that requires a high breakdown voltage and a transistor with a high-performance nanowire structure are formed on a common semiconductor layer, they also have to be separately formed. This also leads to problems of increased number of processes and increased costs caused by the increased processes.

DETAILED DESCRIPTION

A method of manufacturing a semiconductor device according to an embodiment includes: forming a first insulating film on a semiconductor layer; forming a first mask of a charge storing material and a second mask of a charge storing material on the first insulating film, the first mask including a first portion, a second portion, and a third portion extending in a first direction from the first portion to the second portion and connecting the first portion and the second portion, the third portion having a width in a second direction perpendicular to the first direction, and the second mask having a width in a third direction that is wider than the width of the third portion in the second direction; forming a first semiconductor region having a protruded shape and a second semiconductor region having a protruded shape on the semiconductor layer by patterning the first insulating film and the semiconductor layer using the first mask and the second mask, the first semiconductor region including a fourth portion, a fifth portion, and a sixth portion connecting the fourth portion and the fifth portion, and the second semiconductor region having a width in the third direction that is wider than a width of the sixth portion in the second direction; forming an element isolation insulating film between the first semiconductor region and the second semiconductor region; performing selective etching so that the first mask is removed from the third portion but the second mask is left; forming and patterning a second insulating film and a gate electrode material film, thereby forming a gate Insulating film and a first gate electrode at least on a top surface of the sixth portion in the first semiconductor region, and forming a tunnel insulating film, a charge storage film, a block insulating film, and a second gate electrode on the second semiconductor region; and implanting an impurity into the first semiconductor region and the second semiconductor region using the first gate electrode and the second gate electrode as masks, thereby forming first source and drain regions in the fourth portion and the fifth portion of the first semiconductor region, and forming second source and drain regions in the second semiconductor region in a fourth direction perpendicular to the third direction.

Hereinafter, embodiments will be described with reference to the accompanying drawings.

First Embodiment

Figure 1:
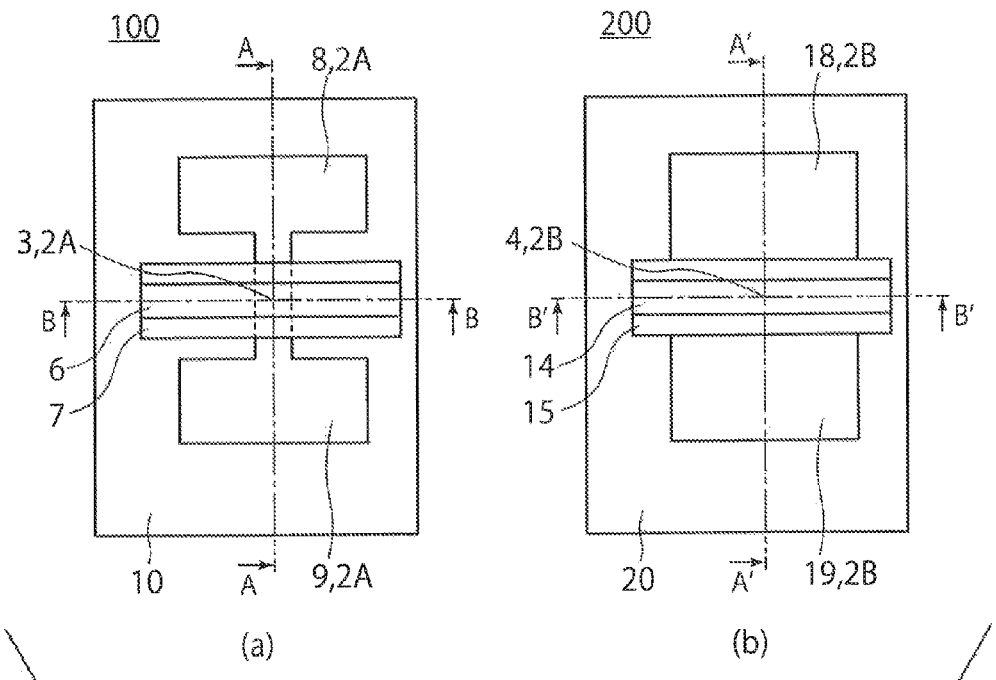
FIGS. 1(a) and 1(b) are top views of a semiconductor device according to the first embodiment.
Figure 2:
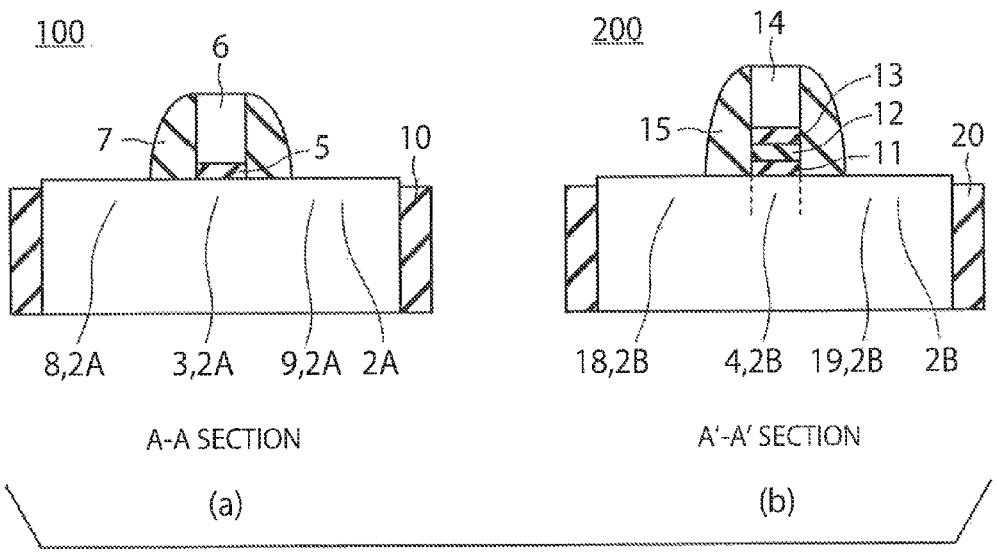
FIGS. 2(a) and 2(b) are cross-sectional views in the gate length direction of the semiconductor device according to the first embodiment.
Figure 3:
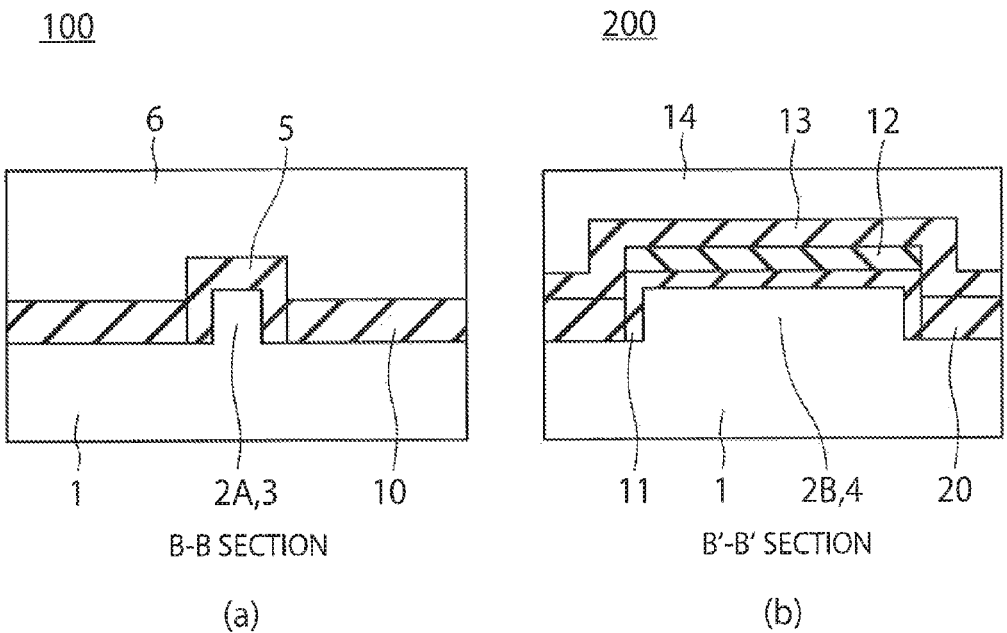
FIGS. 3(a) and 3(b) are cross-sectional views in the gate width direction of a portion under the gate electrode of the semiconductor device according to the first embodiment.
Figure 4:
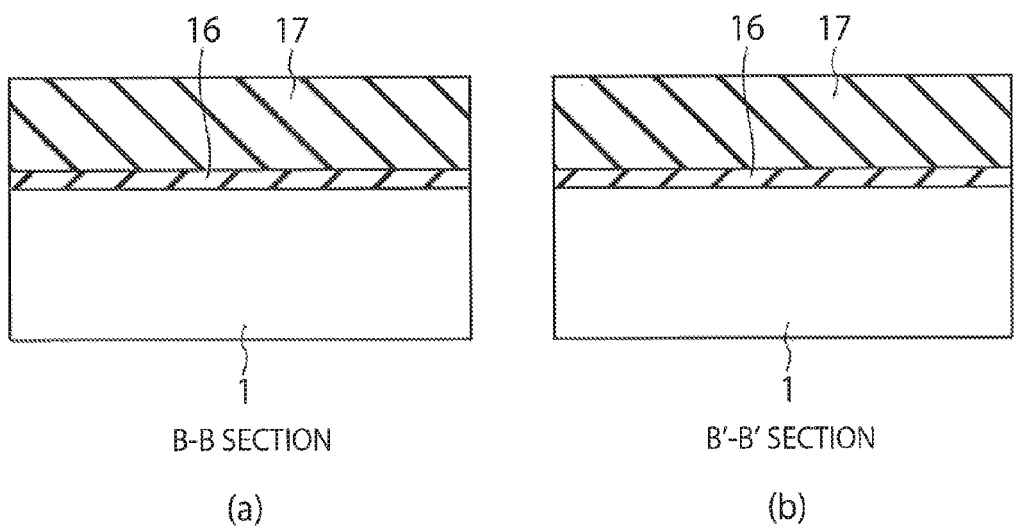
FIGS. 4(a) and 4(b) are cross-sectional views showing a process of a method of manufacturing the semiconductor device according to the first embodiment.

A semiconductor device according to the first embodiment will be described with reference to FIGS. 1(a) to 3(b). The semiconductor device according to this embodiment includes a switching transistor that does not include a silicon nitride film in its gate stack and a nonvolatile memory transistor (hereinafter also referred to as "memory transistor") that includes a silicon nitride film in its gate stack. FIGS. 1(a) and 1(b) show the top views of the switching transistor and the memory transistor, respectively. FIG. 2(a) shows a cross-sectional view of the switching transistor 100 taken along line A-A in FIG. 1(a), and FIG. 3(a) shows a cross-sectional view of the switching transistor 100 taken along line B-B in FIG. 1(a). FIG. 2(b) shows a cross-sectional view of the memory transistor 200 taken along line A'-A' in FIG. 1(b), and FIG. 3(b) shows a cross-sectional view of the memory transistor 200 taken along line B'-B' in FIG. 1(b). The A-A section and the A'-A' section are in the gate length direction, and the B-B section and the B'-B' section are in the gate width direction.

The switching transistor 100 and the memory transistor 200 are formed in a semiconductor region 2A and a semiconductor region 2B, respectively. The semiconductor region 2A and the semiconductor region 2B are protruded regions formed on a semiconductor layer 1.

The semiconductor region 2A includes a first portion and a second portion that are spaced apart from each other, and a narrow portion 3 to serve as a channel region, the third portion connecting the first portion and the second portion, and having a dimension (width) in a second direction that are perpendicular to a first direction from the first portion to the second portion, which dimension is narrower than the width of each of the first portion and the second portion in the second direction. Although FIG. 1(a) shows only one narrow portion 3 to serve as a channel region, more than one narrow portion 3 can be formed.

The switching transistor 100 includes a gate insulating film 5 covering at least the top surface of the narrow portion 3, a gate electrode 6 covering the gate insulating film 5, a source region 8 formed in the first portion, and a drain region 9 formed in the second portion. As shown in FIG. 3(a), the gate insulating film 5 in this embodiment also covers the side portions of the channel region 3.

Specifically, the switching transistor 100 includes the source region 8 and the drain region 9 that are spaced apart from each other in the semiconductor region 2A, and the channel region 3 connecting the source region 8 and the drain region 9, the width in the second direction of the channel region 3 perpendicular to the first direction from the source region 8 to the drain region 9 being narrower than the width in the second direction of the source region 8 and the drain region 9. The side surfaces of the channel region 3, the gate insulating film 5, the source region 8, and the drain region 9 are surrounded by a shallow trench isolation region 10. The channel region 3 has a plate-like structure (nanowire structure) having a width in the second direction, i.e., the length in the gate width direction, of approximately 1 nm to 25 nm, and a height from the top surface of the semiconductor layer 1 of approximately 1 nm to 50 nm. The switching transistor 100 also includes gate sidewalls 7 of an insulating material on side portions of the gate structure having the gate insulating film 5 and the gate electrode 6 on the side of the source region 8 and on the side of the drain region 9.

The semiconductor region 2B has a width that is wider than the width of the narrow portion 2 of the semiconductor region 2A. The memory transistor 200 includes a source region 18 and a drain region 19 that are spaced apart from each other in the semiconductor region 2B, a tunnel insulating film 11 to serve as a channel region 4 formed on the semiconductor region 2B between the source region 18 and the drain region 19, a charge storage film 12 of, for example, a silicon nitride film formed on the tunnel insulating film 11, a block insulating film 13 formed on the charge storage film 12, and a gate electrode 14 formed on the block insulating film 13. The width of the channel region 4 in a fourth direction (gate width direction) perpendicular to a third direction (gate length direction) from the source region 18 to the drain region 19 is substantially the same as the width of each of the source region 18 and the drain region 19 in the fourth direction. The length in the gate width direction of the channel region 4 (gate width) is from 100 nm to 1 μm. Herein, the channel region 4 is also called "wide portion" as compared to the narrow portion 3 of the switching transistor 100. In this embodiment, the tunnel insulating film 11 is also formed on the side surfaces of the channel region along the third direction from the source region 18 to the drain region 19, as shown in FIG. 3(b). The side surfaces of the channel region 4, the tunnel insulating film 11, the source region 18, and the drain region 19 are surrounded by a shallow trench isolation region 20. The memory transistor 200 also includes gate sidewalls 15 of an insulating material on side portions of the gate structure including the tunnel insulating film 11, the charge storage film 12, the block insulating film 13, and the gate electrode 14 on the side of the source region 18 and on the side of the drain region 19.

The memory transistor 200 with such a structure is capable of transferring charge from the channel region 4 to the charge storage film 12 and erasing the charge from the charge storage film 12 by applying a voltage between the gate electrode 14 and the semiconductor region 2B. The memory transistor 200 is also capable of holding the charge in the charge storage film 12 by setting the absolute value of the voltage to be less than or equal to a predetermined value. The above is the memory operation of the memory transistor 200.

As the materials to form the semiconductor layer 1 and the semiconductor regions 2A, 2B, monocrystalline silicon, amorphous silicon, or polycrystalline silicon can be used. Ge or SiGe can be also used.

The requirement of the charge storage film 12 is simply to store the charge. As the charge storage film 12, silicon nitride film, polycrystalline silicon film, amorphous silicon film, microcrystalline silicon film, or hafnia (HfO) film can be used.

(Manufacturing Method)

A method of manufacturing the semiconductor device according to the first embodiment will be described below with reference to FIGS. 4(a) to 13(b).

First, as shown in FIGS. 4(a) and 4(b), an insulating film 16 and a silicon nitride film 17 are sequentially formed on a semiconductor layer 1, for example a bulk silicon substrate 1. The silicon nitride film 17 is to serve as a mask when semiconductor regions 2A, 2B are formed. FIGS. 4(a) and 4(b) show a B-B section and a B'-B' section taken along lines B-B and B'-B' shown in FIGS. 1(a) and 1(b), respectively.

Figure 5:
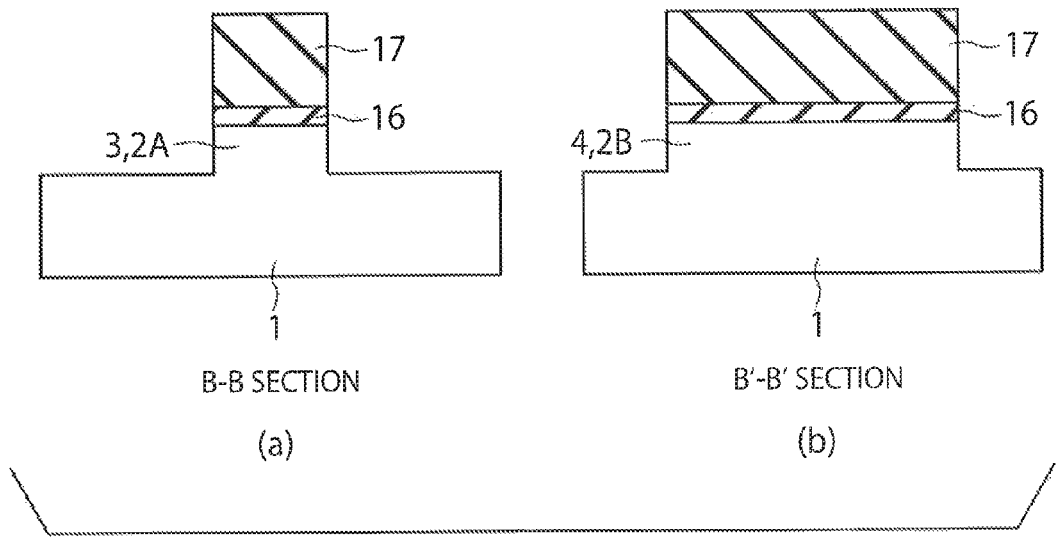
FIGS. 5(a) and 5(b) are cross-sectional views showing a process of the method of manufacturing the semiconductor device according to the first embodiment.
Figure 6:
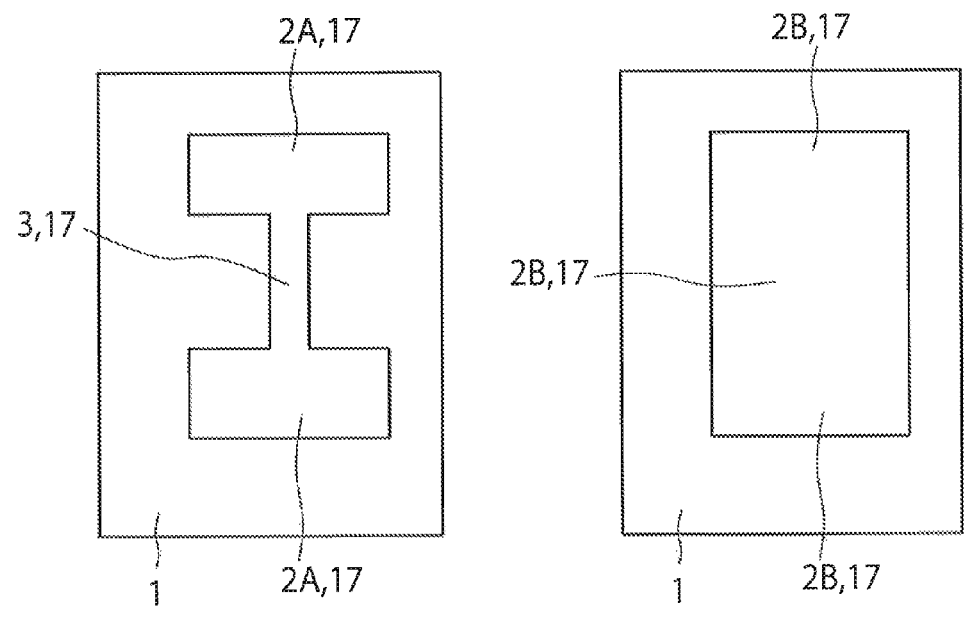
FIGS. 6(a) and 6(b) are top views showing a process of the method of manufacturing the semiconductor device according to the first embodiment.
Figure 7:
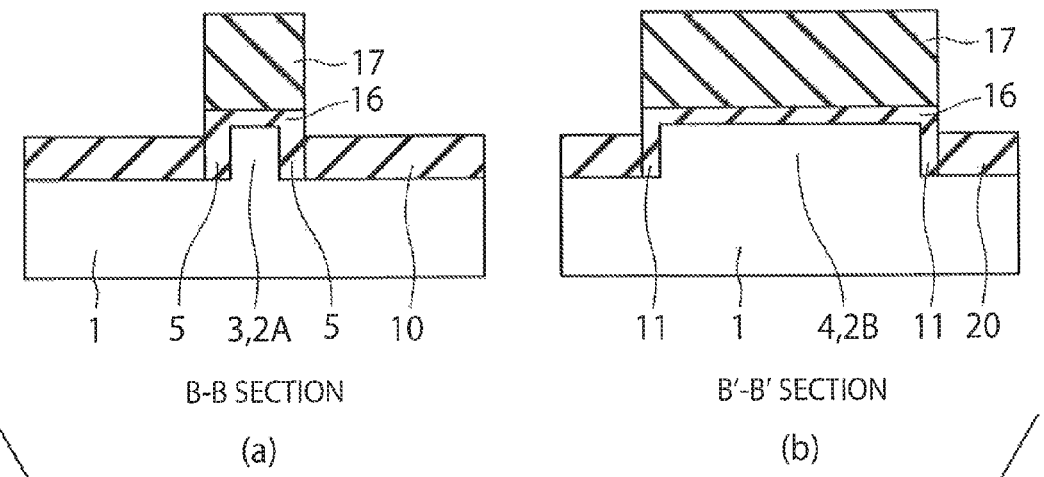
FIGS. 7(a) and 7(b) are cross-sectional views showing a process of the method of manufacturing the semiconductor device according to the first embodiment.
Figure 8:
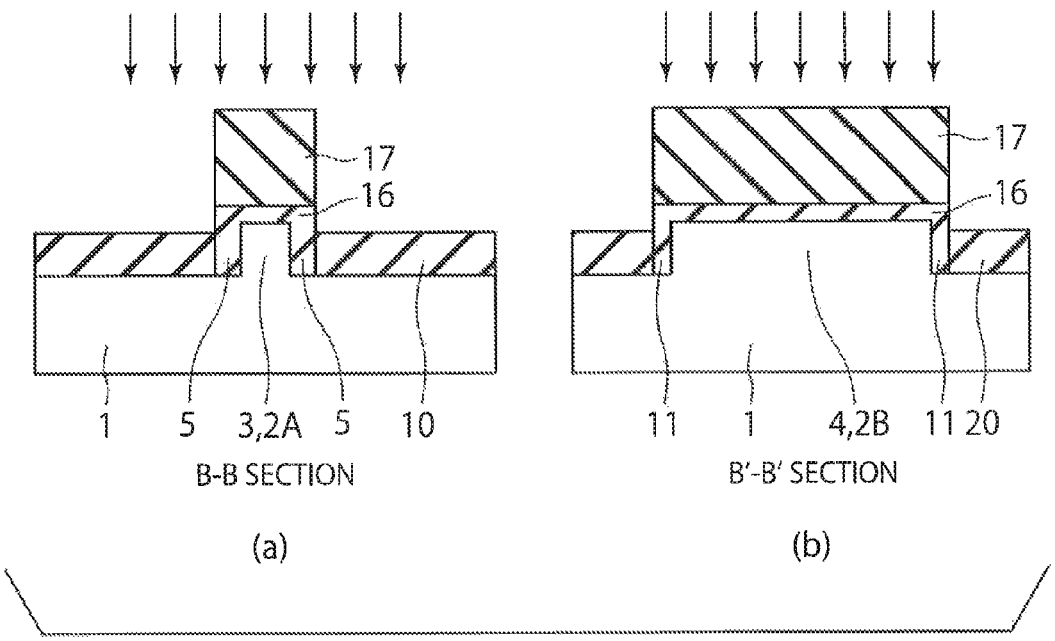
FIGS. 8(a) and 8(b) are cross-sectional views showing a process of the method of manufacturing the semiconductor device according to the first embodiment.
Figure 9:
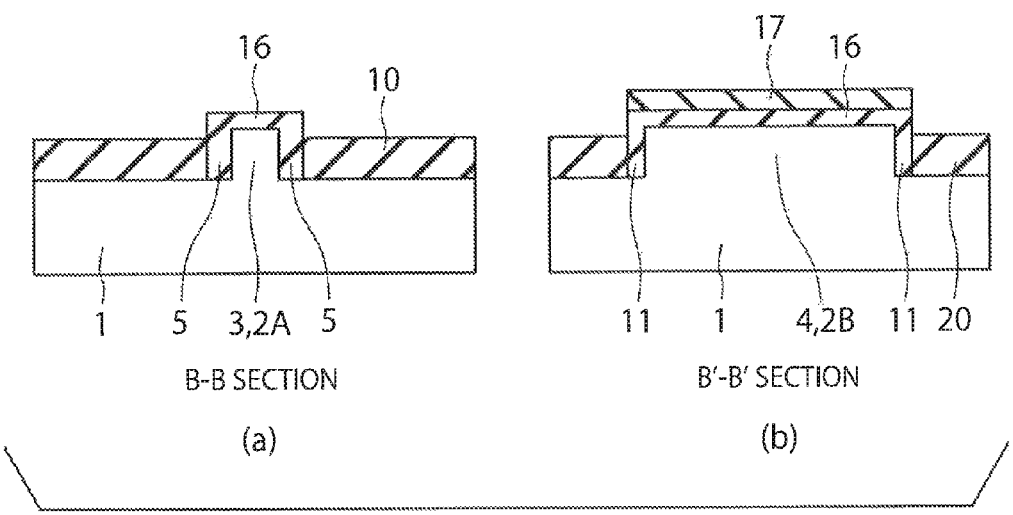
FIGS. 9(a) and 9(b) are cross-sectional views showing a process of the method of manufacturing the semiconductor device according to the first embodiment.
Figure 10:
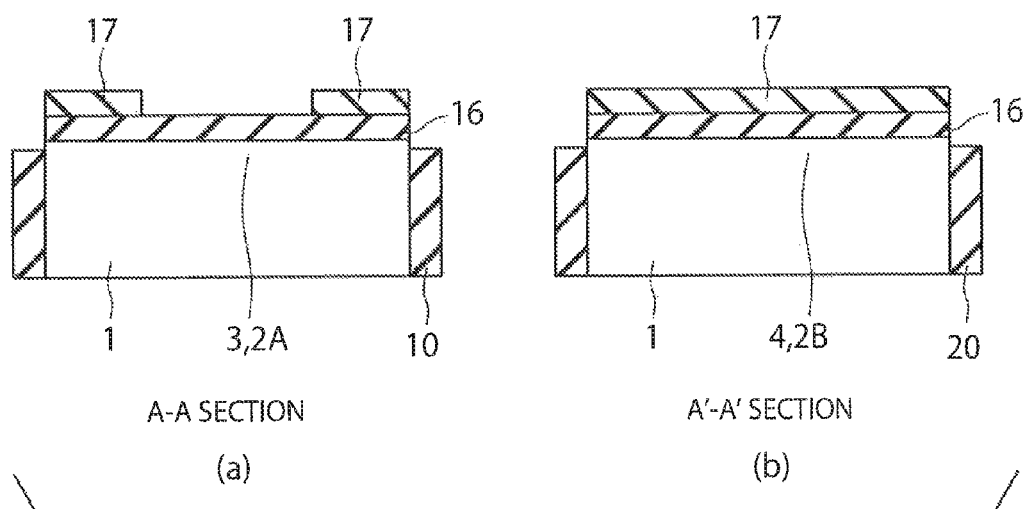
FIGS. 10(a) and 10(b) are cross-sectional views showing a process of the method of manufacturing the semiconductor device according to the first embodiment.
Figure 11:
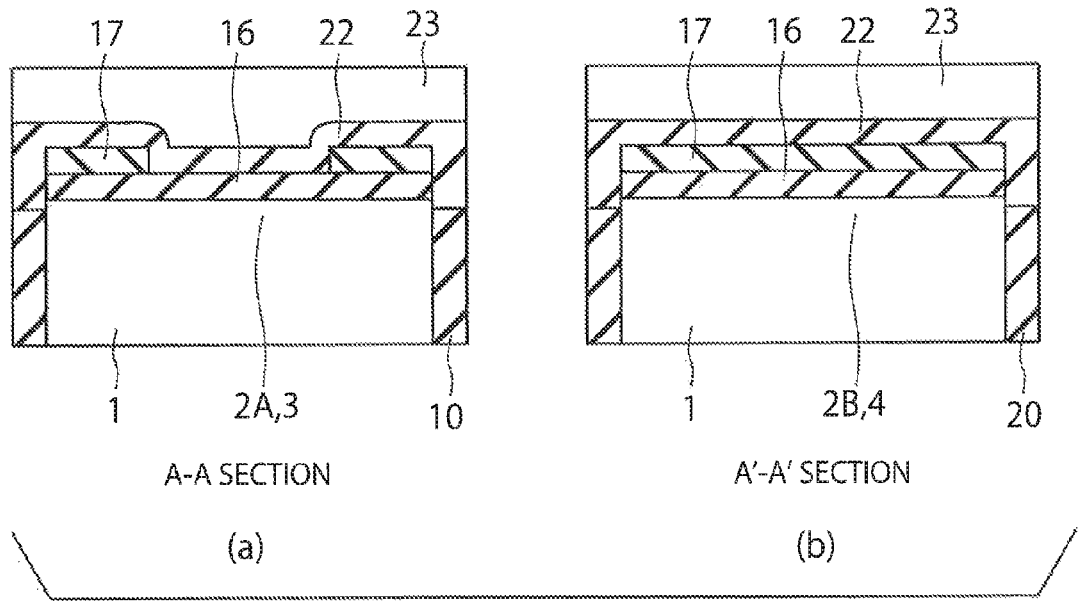
FIGS. 11(a) and 11(b) are cross-sectional views showing a process of the method of manufacturing the semiconductor device according to the first embodiment.
Figure 12:
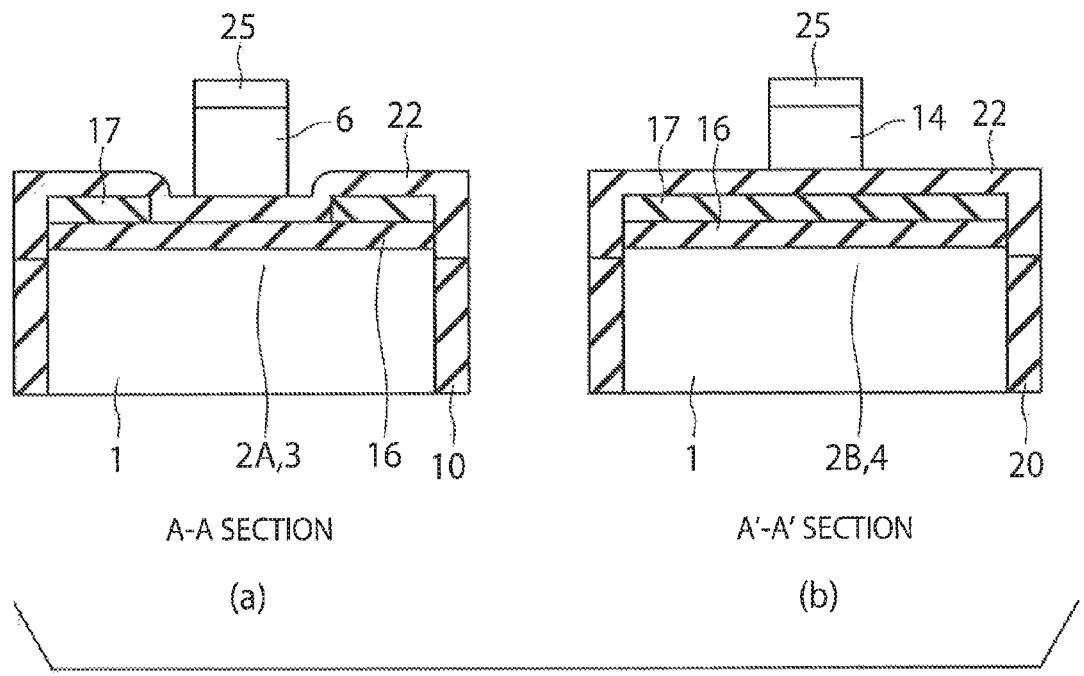
FIGS. 12(a) and 12(b) are cross-sectional views showing a process of the method of manufacturing the semiconductor device according to the first embodiment.
Figure 13:
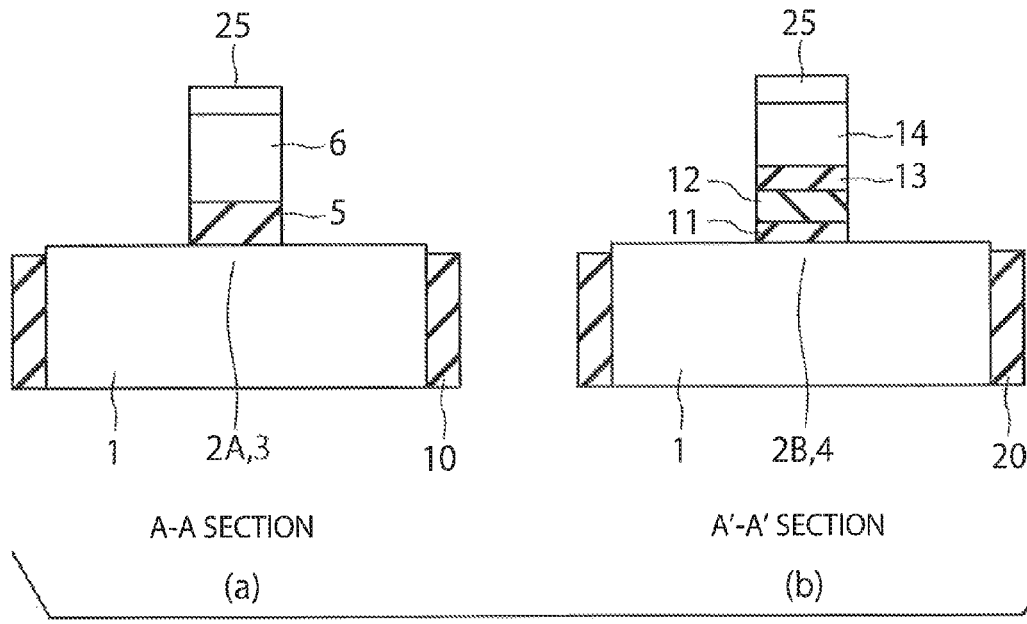
FIGS. 13(a) and 13(b) are cross-sectional views showing a process of the method of manufacturing the semiconductor device according to the first embodiment.

The silicon substrate 1, the insulating film 16, and the silicon nitride film 17 are then patterned to form a semiconductor region 2A having one or more narrow portions 3 and a semiconductor region 2B as shown in FIGS. 5(a) to 6(b). The patterning is performed by a well-known lithographic technique. Dry etching or wet etching can be also used for the patterning. FIGS. 5(a) and 5(b) are a B-B section and a B'-B' section taken along lines B-B, B'-B' shown in FIGS. 1(a) and 1(b), respectively. FIGS. 6(a) and 6(b) are top views of the semiconductor device shown in FIGS. 5(a) and 5(b).

Next, the side surfaces of the narrow portion 3 to serve as a channel region and the semiconductor region 2B are oxidized to form oxide insulating films 5, 11 as shown in FIGS. 7(a) and 7(b). The oxide insulating films are also formed on the side surfaces of the regions to serve as sources and drains of the switching transistor and the memory transistor. An element isolation insulating film is then formed, and chemical mechanical planarization (CMP) and wet etching are performed on the element isolation insulating film to form shallow trench isolation regions 10, 20. FIGS. 7(a) and 7(b) are a B-B section and a B'-B' section taken along lines B-B and B'-B' shown in FIGS. 1(a) and 1(b).

Subsequently, dry etching is performed as shown in FIGS. 8(a) and 8(b). The etching is performed for a certain period of time, by which the silicon nitride film 17 on the narrow portion 3 is removed but the silicon nitride film 17 on the semiconductor region 2B is left since the etching rate of the silicon nitride film 17 on the narrow portion 3 is faster than that of the silicon nitride film 17 on the semiconductor region 2B that is wider. FIGS. 8(a) and 8(b) are a B-B section and a B'-B' section taken along lines B-B and B'-B' shown in FIGS. 1(a) and 1(b), respectively. FIGS. 9(a) and 9(b) show sections of the semiconductor device after etching, taken along lines B-B and B'-B' shown in FIGS. 1(a) and 1(b), respectively, and FIGS. 10(a) and 10(b) show sections taken along lines A-A and A'-A' show in FIGS. 1(a) and 1(b), respectively.

Thereafter, an insulating film 22 and a gate electrode material film 23 are sequentially deposited as shown in FIGS. 11(a) and 11(b). Silicon oxide and a high-k material having a dielectric constant higher than that of silicon oxide can be used to form the insulating film 22. Polycrystalline silicon, for example, can be used to form the gate electrode material film 23. The insulating films 16 and 22 on the narrow portion 3 serve as a gate insulating film 5 of the switching transistor. The thickness of the gate insulating film 5 may be reduced by removing the insulating film 16 on the narrow portion 3 by selective wet etching or selective dry etching before the Insulating film 22 is deposited. The insulating film 16 may be selectively removed in such a manner that the insulating film 16 on the narrow portion 3 is removed in a pass transistor etc. that requires a high-speed operation, but is not removed in a transistor used in, for example, a peripheral power supply circuit that requires a high breakdown voltage.

A mask 25 in a gate electrode shape is then formed on the gate electrode material film 23, and the gate electrode material film 23 is patterned using the mask 25 to form a gate electrode 6 and a gate electrode 14 (FIGS. 12(a) and 12(b)). A silicon nitride film or silicon oxide film can be used to form the mask 25. If the silicon nitride film is used, it is preferable that the film has a sufficient thickness so that the mask 25 is left after the etching of the silicon nitride film 17. If the silicon oxide film is used, it is preferable that the film has a sufficient thickness so that the mask 25 is left after the etching of the insulating film 22. Thereafter, in the semiconductor region 2A where the switching transistor is to be formed, the gate insulating film 22 is patterned by using the mask 25. At this time, in this region, the insulating film 22 on the regions where the source and the drain are to be formed is removed. In the semiconductor region 2B where the memory transistor is to be formed, the insulating film 22 on the regions where the source and the drain are to be formed is removed. The insulating film 22 under the gate electrode 14, however, is patterned and a block insulating film 13 is formed. The silicon nitride film 17 is then etched by using the mask 25 so as to be removed from the regions where the source and the drain are to be formed in the semiconductor region 2A where the switching transistor is to be formed. At the same time, the silicon nitride film 17 in the semiconductor region 2B where the memory transistor is to be formed is patterned. The patterned silicon nitride film 17 serves as a charge storage film 12. The insulating film 16 is then patterned using the mask 25 to form the gate insulating film 5 in the semiconductor region 2A where the switching transistor is to be formed, and to form the tunnel insulating film 11 in the semiconductor region 2B where the memory transistor is to be formed (FIGS. 13(a) and 13(b)).

Then, impurity ions are implanted and activated in the regions where the source and the drain are to be formed to form the source region 8 and the drain region 9 in the semiconductor region 2A where the switching transistor is to be formed, and to form the source region 18 and the drain region 19 in the semiconductor region 2B where the memory transistor is to be formed. Thereafter, gate sidewalls 7 and gate sidewalls 15 of an insulating material are formed on the side surfaces of the gate electrode 6 and the gate electrode 14. As a result, the switching transistor 100 and the memory transistor 200 shown in FIGS. 1(a) to 3(b) are formed.

Examples of the materials to form the gate electrodes 6, 14 include polycrystalline silicon, a metal silicide, TiN, W, TaC, and a stacked layer including films of polycrystalline silicon and a metal.

The gate sidewalls 7, 15 can be formed of, for example, an oxide film, a nitride film, and a stacked layer including an oxide film and a nitride film.

Although a normal planar transistor is formed on the narrow portion 3 by forming the shallow trench isolation region 10 in the foregoing descriptions, a Tri-gate structure can be employed, in which the shallow trench isolation region 10 is not formed, and the gate electrode 6 is formed after the side surfaces of the narrow portion 3 are oxidized to use the side surfaces of the narrow portion 3 a part of the channel.

Incidentally, the regions other than the channel region in the narrow portion 3 can be formed by epitaxial growth in order to reduce the parasitic resistance.

According to this manufacturing method, it is possible to form the switching transistor and the memory transistor having different structures simultaneously with a small number of processes.

This manufacturing method uses the difference in the etching rate of the silicon nitride film 17 between the narrow portion 3 and the wide portion 4 as shown in FIGS. 9(a) and 9(b). Samples are prepared to perform a test with respect to the above point. The result of this test will be described below with reference to FIGS. 14(a) to 14(e).

Figure 14:
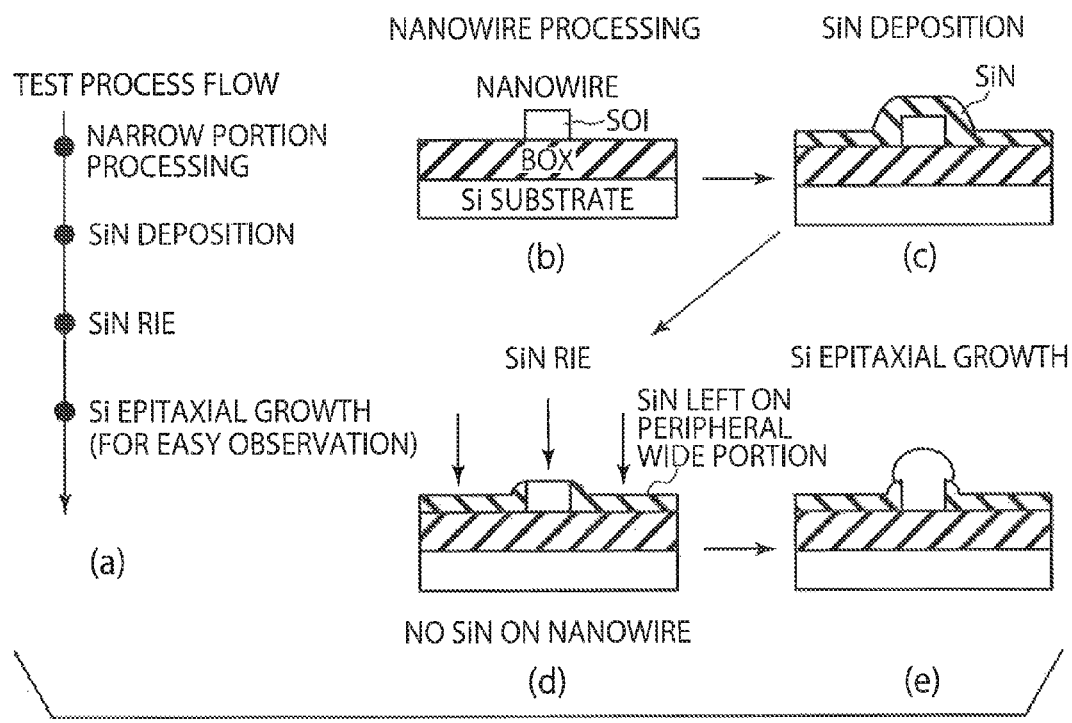
FIGS. 14(a) to 14(e) are drawings for explaining the difference in etching rate of silicon nitride film between a narrow portion and a wide portion.

FIG. 14(a) shows a test process flow chart of forming the narrow portion and the wide portion and performing dry etching. FIGS. 14(b) to 14(e) show cross-sectional views in the respective processes. The etching rate of the narrow portion 3 is compared with that of the wide portion 4 by preparing a sample with a narrow portion and comparing the silicon nitride film on the narrow portion with that on a wide portion surrounding the narrow portion. For example, an SOI substrate including a support substrate of Si, a buried oxide film (BOX), and a silicon on insulator (SOI) layer as shown in FIGS. 14(a) and 14(b) is prepared. The SOI layer is patterned by using a lithographic technique to form a fine wire to serve as the narrow portion. Then, SiN is deposited to cover the narrow portion, and a silicon nitride film (SiN film) is formed (FIGS. 14(a) and 14(c)). Subsequently, dry etching (for example, reactive ion etching (RIE)) is performed on the SiN film to remove the SiN on the narrow portion (FIGS. 14(a) and 14(d)). In order to easily observe that the silicon nitride film on the top surface of the narrow portion is completely removed, silicon epitaxial growth is performed after the dry etching. As a result, a portion of the silicon layer not covered by the silicon nitride film expands. It is observed that the silicon layer in the narrow portion expands, but the silicon layer in the wide portion surrounding the narrow portion does not expand (FIGS. 14(a) and 14(e)). Thus, it is confirmed that no silicon nitride film is present on the top surface of the narrow portion.

Figure 15:
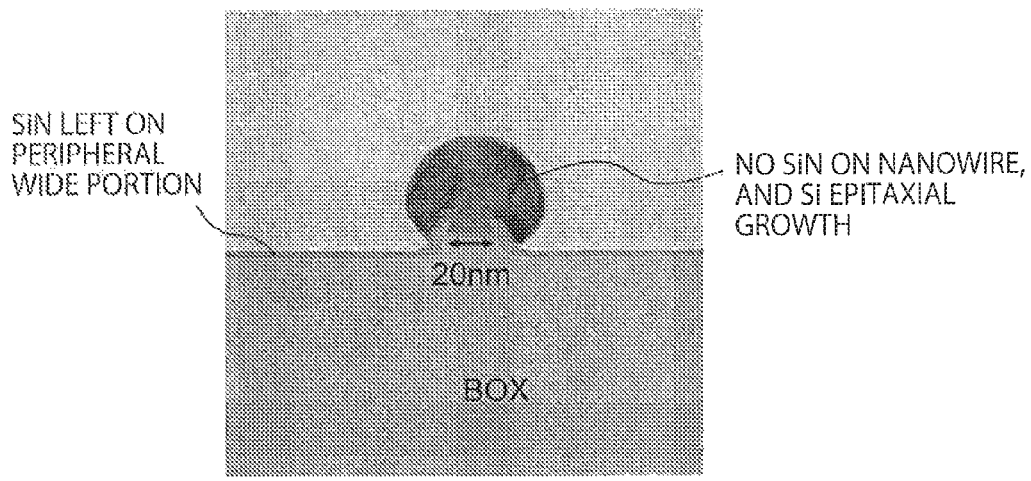
FIG. 15 is a photomicrograph showing that no silicon nitride film is present on the narrow portion.
Figure 16:
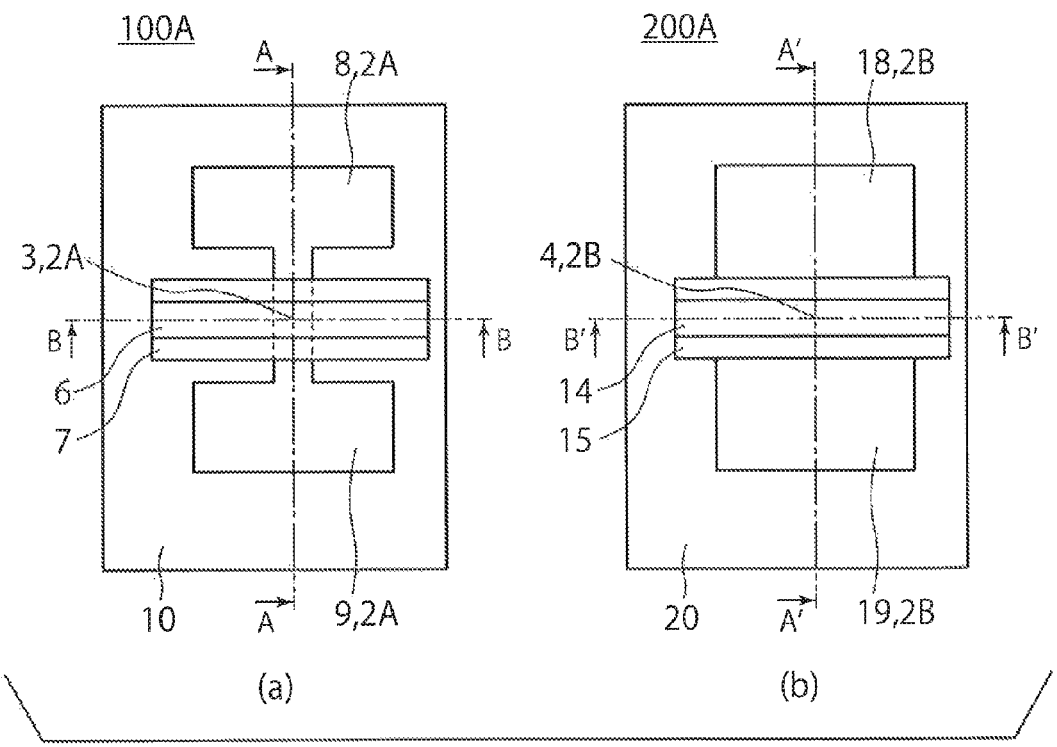
FIGS. 16(a) and 16(b) are top views of a semiconductor device according to a second embodiment.
Figure 17:
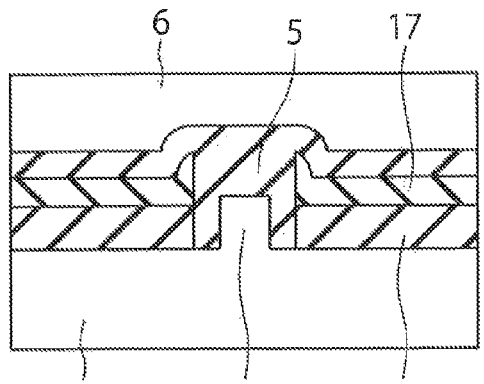
FIGS. 17(a) and 17(b) are cross-sectional views in the gate width direction under the gate electrode of the semiconductor device according to the second embodiment.
Figure 17:
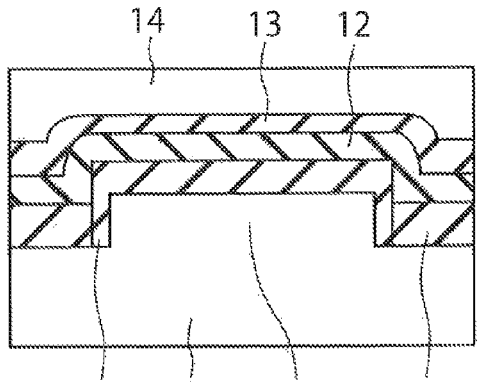
Figure 18:
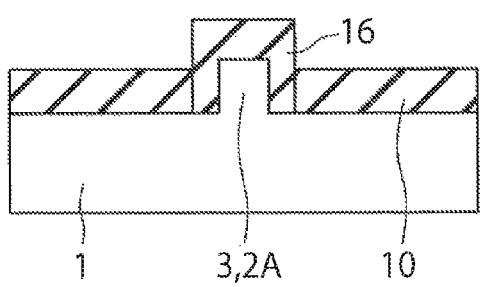
FIGS. 18(a) and 18(b) are cross-sectional views showing a process of a method of manufacturing the semiconductor device according to the second embodiment.
Figure 18:
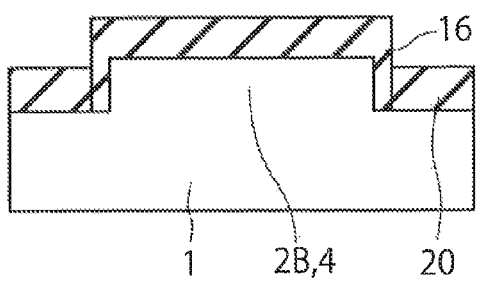
Figure 19:
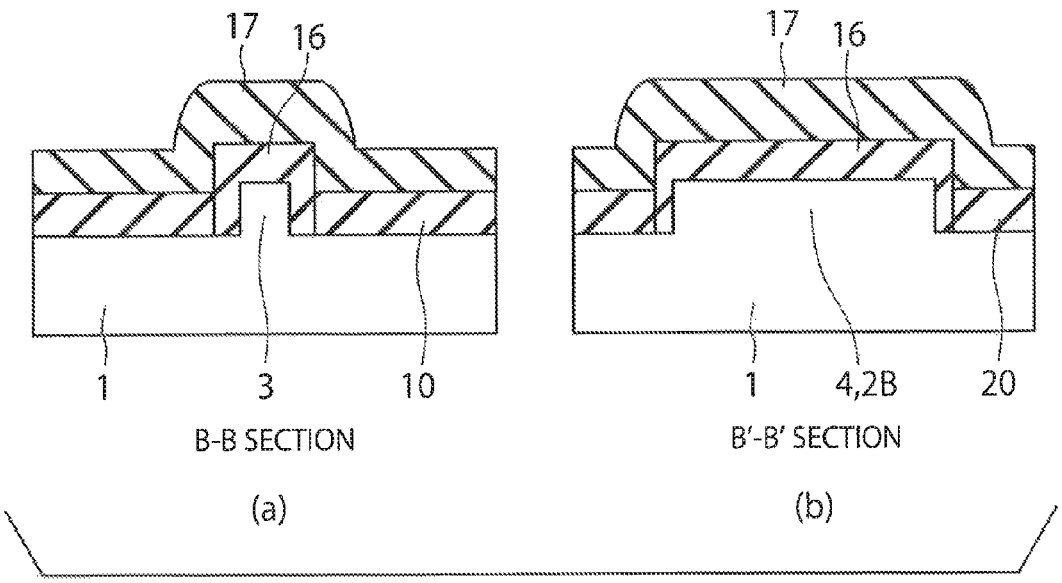
FIGS. 19(a) and 19(b) are cross-sectional views showing a process of the method of manufacturing the semiconductor device according to the second embodiment.
Figure 20:
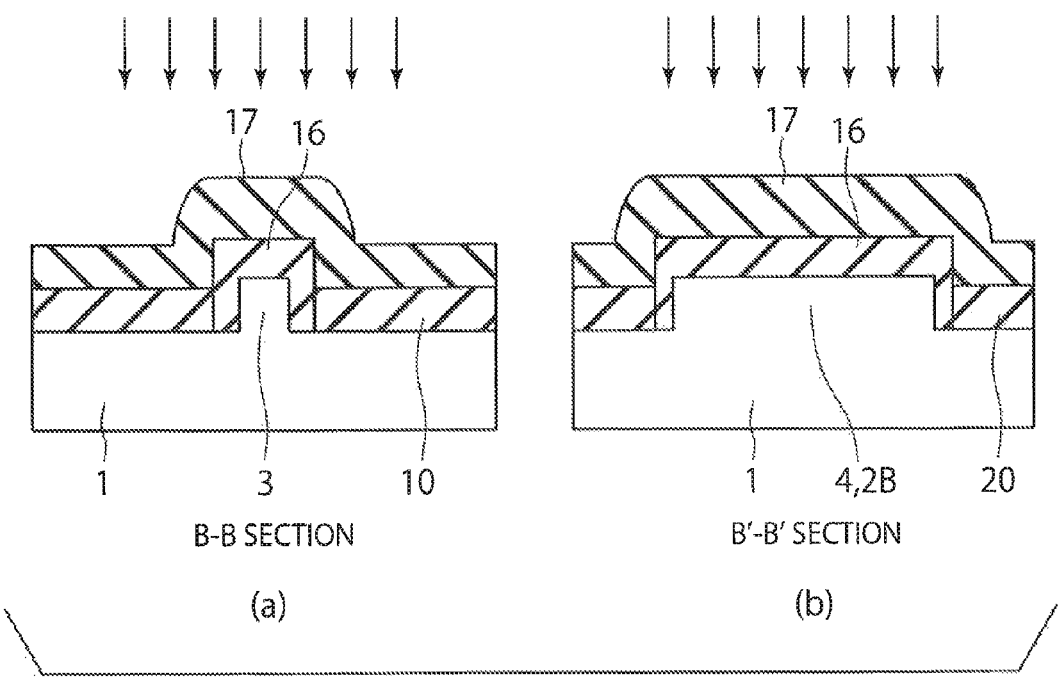
FIGS. 20(a) and 20(b) are cross-sectional views showing a process of the method of manufacturing the semiconductor device according to the second embodiment.
Figure 21:
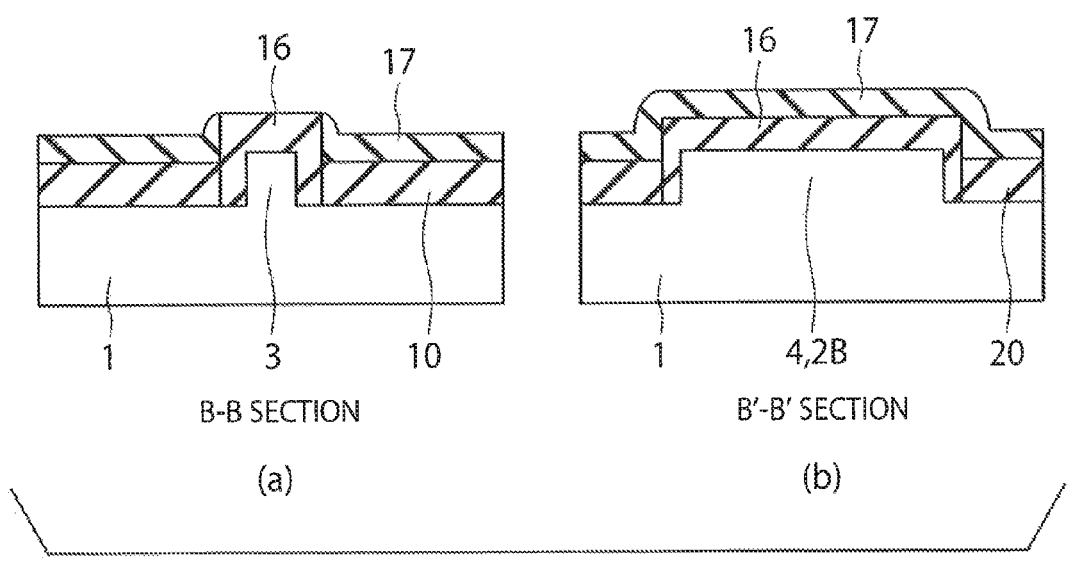
FIGS. 21(a) and 21(b) are cross-sectional views showing a process of the method of manufacturing the semiconductor device according to the second embodiment.
Figure 22:
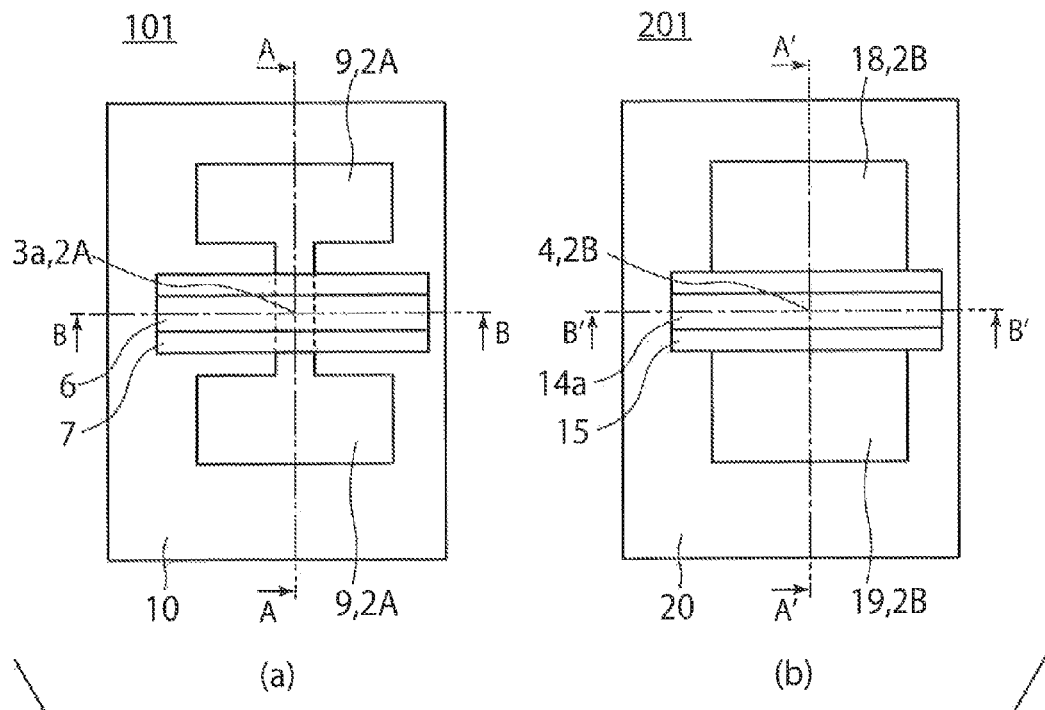
FIGS. 22(a) and 22(b) are top views of a semiconductor device according to a third embodiment.
Figure 23:
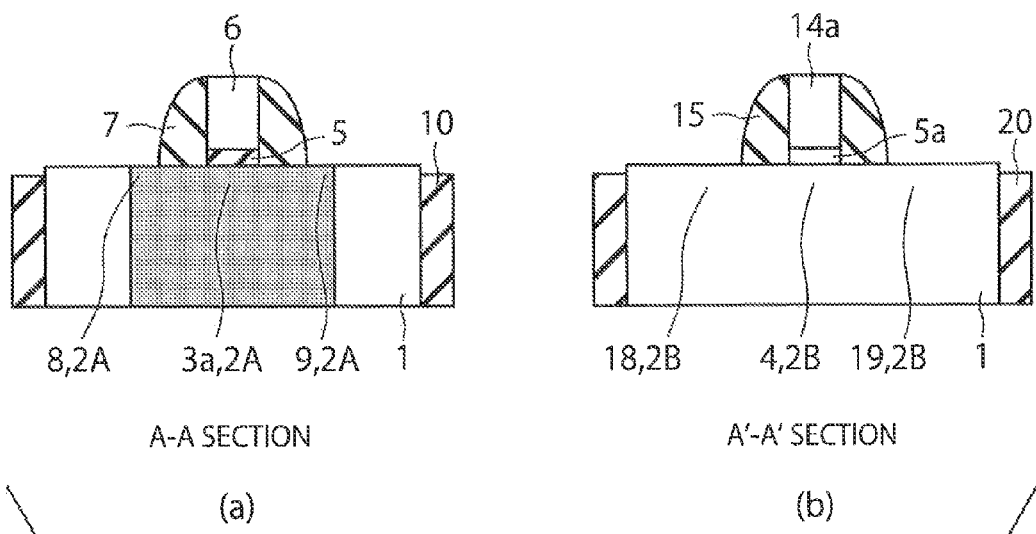
FIGS. 23(a) and 23(b) are cross-sectional views in the gate length direction of the semiconductor device according to the third embodiment.
Figure 24:
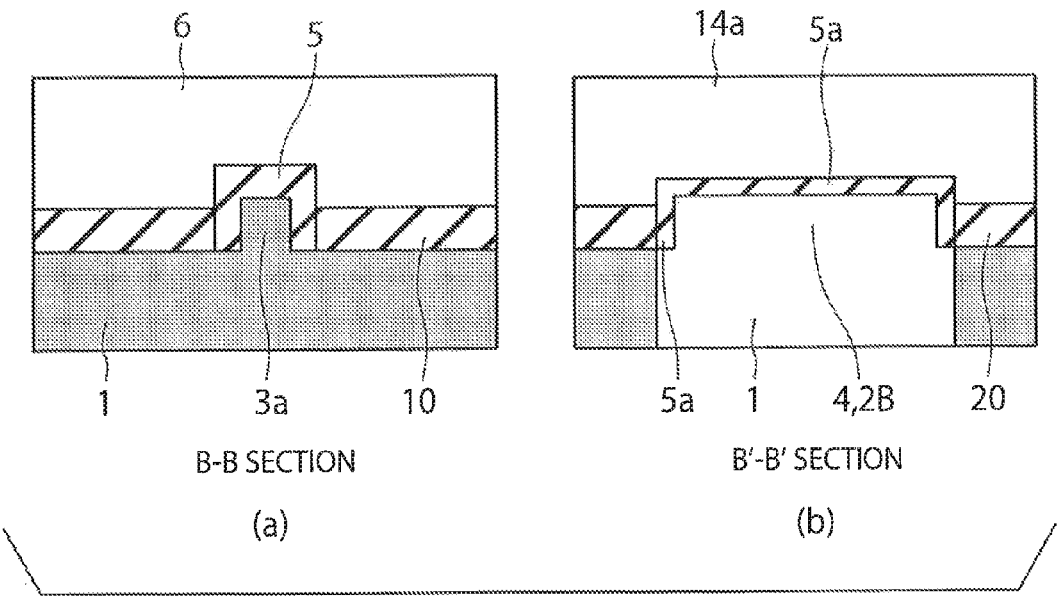
FIGS. 24(a) and 24(b) are cross-sectional views in the gate width direction under the gate electrode of the semiconductor device according to the third embodiment.
Figure 25:
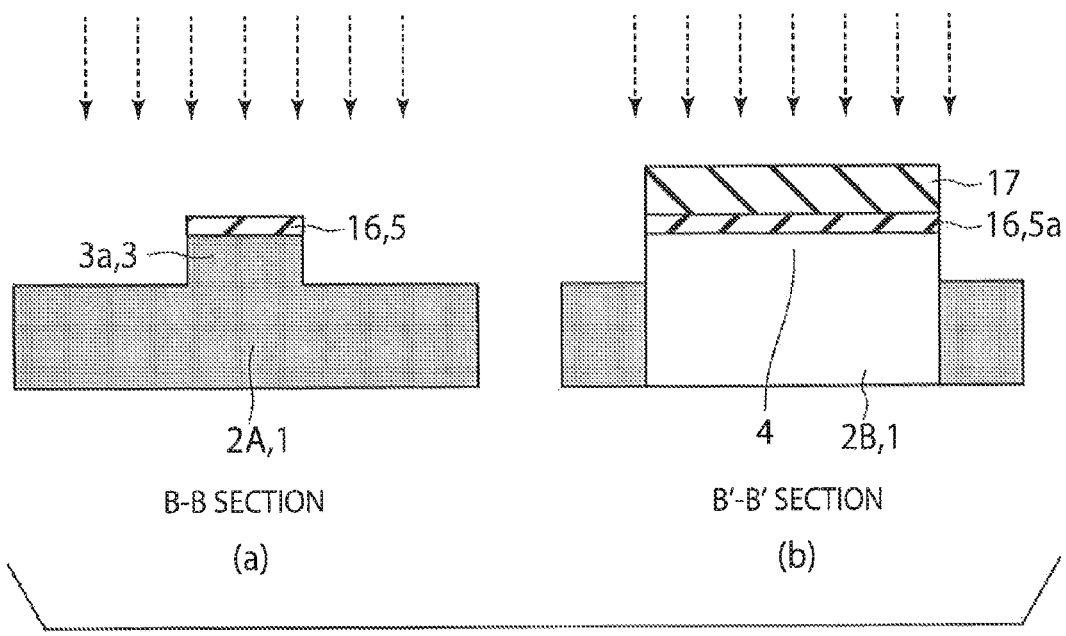
FIGS. 25(a) and 25(b) are cross-sectional views showing a process of a method of manufacturing the semiconductor device according to the third embodiment.

FIG. 15 shows a section of the sample after being subjected to the processes shown in FIGS. 14(a) to 14(e), observed by a transmission electron microscope (TEM). As can be understood from FIG. 15, the silicon nitride film on the narrow portion is completely removed, and therefore the silicon layer expands due to the epitaxial growth. The silicon nitride film in the wide portion surrounding the narrow portion is left.

The difference in the etching rate between the silicon nitride film 17 on the narrow portion 3 and the silicon nitride film 17 on the wide portion 4 used in the manufacturing method according to this embodiment is proved in the foregoing descriptions.

As described above, according to the first embodiment, it is possible to provide a semiconductor device in which a nonvolatile memory transistor and a switching transistor can be formed with a small number of processes, and a method of manufacturing such a semiconductor device.

Although the semiconductor layer 1 in the first embodiment is a bulk substrate, it may be an SOI layer of an SOI substrate.

The switching transistor 100 in the first embodiment has the channel region 3 having a width in the second direction narrower than that of each of the source region 8 and the drain region 9 in the second direction. However, if the width of the channel region 3 in the second direction is equal to the width of each of the source region 8 and the drain region 9 in the second direction, and narrower than the width of the channel region 4 of the memory transistor 200 in the direction perpendicular to the direction from the source region 18 to the drain region 19, the same effect as that of the first embodiment can be obtained. In such a case, the silicon nitride film 17 in the regions to serve as a source region and a drain region is also removed when the silicon nitride film 17 on the narrow portion 3 is removed. However, the silicon nitride film in the regions to serve as a source region and a drain region may be left as shown in FIG. 10(a).

Second Embodiment

A semiconductor device according to the second embodiment will be described with reference to FIGS. 16(a) to 17(b). The difference between the second embodiment and the first embodiment is the order of the deposition of the charge storage film and the formation of the shallow trench isolation region. In the first embodiment, the charge storage film is deposited before the shallow trench isolation region is formed. However, in the second embodiment, the charge storage film is deposited after the shallow trench isolation region is formed.

The semiconductor device according to the second embodiment includes a switching transistor that does include a silicon nitride film in its gate stack, and a memory transistor that includes a silicon nitride film in its gate stack. FIGS. 16(a) and 16(b) show top views of a switching transistor 100A and a memory transistor 200A. FIG. 17(a) shows a cross-sectional view of the switching transistor 100A taken along line B-B in FIG. 16(a), and FIG. 17(b) shows a cross-sectional view of the memory transistor 200A taken along line B'-B' in FIG. 16(b). Incidentally, the cross-sectional views taken along lines A-A and A'-A' in FIGS. 16(a) and 16(b) are the same as the cross-sectional views shown in FIGS. 2(a) and 2(b) for describing the first embodiment. The A-A and A'-A' sections are in the gate length direction, and the B-B and B'-B' sections are in the gate width direction.

The switching transistor 100A and the memory transistor 200A are formed in a semiconductor region 2A and a semiconductor region 2B, respectively, which are protruded regions formed on a semiconductor layer 1.

The semiconductor region 2A includes a first portion and a second portion that are spaced apart from each other, and a narrow portion 3 to serve as a channel region that connects the first portion and the second portion, the width of the narrow portion 3 in a second direction that is perpendicular to a first direction from the first portion to the second portion is narrower than the width of each of the first portion and the second portion in the second direction. Although there is only one narrow portion 3 to serve as a channel region in FIG. 16(a), more than one narrow portion 3 can be formed.

The switching transistor 100A includes a gate insulating film 5 covering at least the top surface of the narrow portion 3, a gate electrode 6 covering the gate insulating film 5, a source region 8 formed in the first portion, and a drain region 9 formed in the second portion. The gate insulating film 5 in this embodiment is formed on both the side surfaces of the channel region 3 and extends over the shallow trench isolation region 10, as shown in FIG. 17(a). A film of the same material as the material of the charge storage film 12 of the memory transistor 200A, e.g., a silicon nitride film 17, is formed between the shallow trench isolation region 10 and the gate insulating film 5. The silicon nitride film 17 is formed on both the side surfaces of the channel region 3, and connected to the side surfaces of the gate insulating film 5. The portions of the silicon nitride film 17 connecting to the side surfaces of the gate insulating film 5 project upward relative to the other portions of the silicon nitride film 17.

Thus, the switching transistor 100A includes the source region 8 and the drain region 9 that are spaced apart from each other in the semiconductor region 2A, and a channel region 3 connecting the source region 8 and the drain region 9, the width of the channel region 3 in the second direction that is perpendicular to the first direction from the source region 8 to the drain region 9 being narrower than the width of each of the source region 8 and the drain region 9 in the second direction. The side surfaces of the channel region 3, the gate insulating film 5, the source region 8, and the drain region 9 are surrounded by the shallow trench isolation region 10. The channel region 3 has a plate-like structure (nanowire structure) having a width in the second direction, i.e., a length in the gate width direction of approximately 1 nm to 25 nm, and a height from the top surface of the semiconductor layer 1 of approximately 1 nm to 50 nm. The switching transistor 100A also includes gate sidewalls 7 of an insulating material on side surfaces of the gate structure including the gate insulating film 5 and the gate electrode 6 on the source region 8 side and the drain region 9 (FIG. 2(a)).

The semiconductor region 2B has a width that is wider than the width of the narrow portion 2 of the semiconductor region 2A. The memory transistor 200A includes a source region 18 and a drain region 19 that are spaced apart from each other in the semiconductor region 2B, a tunnel insulating film 11 to serve as a channel region (wide portion) 4 formed on the semiconductor region 2B between the source region 18 and the drain region 19, a charge storage film 12 of, for example, a silicon nitride film formed on the tunnel insulating film 11, a block insulating film 13 formed on the charge storage film 12, and a gate electrode 14 formed on the block insulating film 13. The width of the channel region 4 in a fourth direction (gate width direction) that is perpendicular to a third direction (gate length direction) from the source region 18 to the drain region 19 is substantially the same as the width of each of the source region 18 and the drain region 19 in the fourth direction. The length in the gate width direction of the channel region 4 (gate width) is from 100 nm to 1 μm. In this embodiment, the tunnel insulating film 11 is also formed on the side surfaces of the channel region along the third direction from the source region 18 to the drain region 19 as shown in FIG. 17(b). The side surfaces of the channel region 4, the tunnel insulating film 11, the source region 18, and the drain region 19 are surrounded by a shallow trench isolation region 20. The charge storage film 12 also extends over the shallow trench isolation region 20, and the block insulating film 13 extends over the charge storage film 12. The memory transistor 200A also includes gate sidewalls 15 of an insulating material on side portions of the gate structure having the tunnel insulating film 11, the charge storage film 12, the block insulating film 13, and the gate electrode 14 on the source region 18 side and on the drain region 19 side.

The memory transistor 200A with such a structure is capable of transferring charge from the channel region 4 to the charge storage film 12 and erasing the charge from the charge storage film 12 by applying a voltage between the gate electrode 14 and the semiconductor region 2B. The memory transistor 200A is also capable of holding the charge in the charge storage film 12 by setting the absolute value of the voltage to be less than or equal to a predetermined value. The above is the memory operation of the memory transistor 200. As examples of the material to form the semiconductor layer 1 and the semiconductor regions 2A, 2B, monocrystalline silicon, amorphous silicon, or polycrystalline silicon can be used.

The requirement of the charge storage film 12 is simply to store the charge. As examples of the charge storage film 12, silicon nitride film, polycrystalline silicon film, amorphous silicon film, microcrystalline silicon film, or hafnia film can be used.

(Manufacturing Method)

A method of manufacturing the semiconductor device according to the second embodiment will be described below with reference to FIGS. 18(a) to 21(b).

First, a semiconductor layer 1, for example a bulk silicon substrate 1, is processed using a lithographic technique to form a semiconductor region 2A and a semiconductor region 2B on the bulk silicon substrate 1, as shown in FIGS. 18(a) and 18(b). At this time, a narrow portion 3 is formed in the semiconductor region 2A, and a wide portion 4 is formed in the semiconductor region 2B. Thereafter, an insulating film 16 covering the top surfaces and the side surfaces of the wide portion 4 and the narrow portion 3 is formed. The insulating film 16 may be formed of, for example, a silicon oxide film. Thereafter, an element isolation insulating film is formed, on which CMP and wet etching are performed to form shallow trench isolation regions 10, 20. FIGS. 18(a) and 18(b) are a B-B section and a B'-B' section taken along lines B-B and B'-B' in FIGS. 16(a) and 16(b).

A silicon nitride film 17 is then deposited as shown in FIGS. 19(a) and 19(b), which are a B-B section and a B'-B' section taken along lines B-B and B'-B' shown in FIGS. 16(a) and 16(b). Subsequently, dry etching is performed as shown in FIGS. 20(a) and 20(b). The etching time is determined so as to remove the silicon nitride film 17 on the narrow portion 3 and to leave the silicon nitride film 17 on the wide portion 4 by using the feature that the etching rate of the silicon nitride film 17 on the narrow portion 3 is faster than that of the silicon nitride film 17 on the wide portion 4. FIGS. 20(a) and 20(b) are a B-B section and a B'-B' section taken along lines B-B and B'-B' shown in FIGS. 16(a) and 16(b), respectively. FIGS. 21(a) and 21(b) are cross-sectional views of the source region and the drain region in the gate width direction after the etching. FIGS. 21(a) and 21(b) are a B-B section and a B'-B' section taken along lines B-B B'-B' shown in FIGS. 16(a) and 16(b).

Thereafter, the same processes as those in the first embodiment are performed. Specifically, an insulating film 22 is deposited and a gate electrode material film 23 is deposited on the insulating film 22 as have been described with reference to FIGS. 11(a) and 11(b). A mask is then formed, and the gate electrode material film 23 and the insulating film 22 are patterned using the mask. As a result, a gate electrode 6 and a gate insulating film 5 are formed in the semiconductor region 2A where the switching transistor is to be formed, and a gate electrode 14, a block insulating film 13, a charge storage film 12, and a tunnel insulating film 11 are formed in the semiconductor region 2B where the memory transistor is to be formed (FIGS. 13(a) and 13(b)).

The gate electrodes 6, 14 and the gate sidewalls 7, 15 may be formed of the same materials as having been described in the descriptions of the first embodiment. Furthermore, the gate insulating film 5 and the tunnel insulating film 11 may be formed of the same materials as having been described in the descriptions of the first embodiment.

The narrow portion 3, other than the channel region, can be epitaxially grown in order to reduce the parasitic resistance.

According to this manufacturing method, the switching transistor and the memory transistor, each having a different structure, can be formed at the same time.

As described above, according to the second embodiment, it is possible to provide a semiconductor device in which a nonvolatile memory transistor and a switching transistor can be formed with a small number of processes, and a method of manufacturing such a semiconductor device, as in the first embodiment.

Although the semiconductor layer 1 in the second embodiment is a bulk substrate, it can be an SOI layer of an SOI substrate.

The switching transistor 100A of the second embodiment has the channel region 3, the width of which in the second direction is narrower than the width of each of the source region 8 and the drain region 9 in the second direction. However, the same effect as that of the second embodiment can be obtained if the width of the channel region 3 in the second direction is equal to the width of each of the source region 8 and the drain region 9 in the second direction, and narrower than the width of the channel region 4 of the memory transistor 200A in the direction perpendicular to the direction from the source region 18 to the drain region 19. In this case, when the silicon nitride film 17 on the narrow portion 3 is removed, the silicon nitride film 17 on the regions to be the source region and the drain region is also removed. However, the silicon nitride film may be selectively left on the regions to be the source region and the drain region.

Third Embodiment

A semiconductor device according to the third embodiment will be described with reference to FIGS. 22(a) to 25(b). The semiconductor device according to the third embodiment includes a first transistor having a nanowire structure and a second transistor having a channel width wider than that of the first transistor. In order to adjust the threshold value, an impurity is implanted into a narrow portion to serve as the nanowire of the first transistor, but no impurity is implanted into the wider channel region of the second transistor.

FIGS. 22(a) and 22(b) are top views of the first transistor 101 and the second transistor 201. FIG. 23(a) is a cross-sectional view of the first transistor 101 taken along line A-A shown in FIG. 22(a), and FIG. 24(a) is a cross-sectional view of the first transistor 101 taken along line B-B shown in FIG. 22(a). FIG. 23(b) is a cross-sectional view of the second transistor 201 taken along line A'-A' shown in FIG. 22(b), and FIG. 24(b) is a cross-sectional view of the second transistor 201 taken along line B'-B' shown in FIG. 22(b). The A-A and A'-A' sections are in the gate length direction, and the B-B and B'-B' sections are in the gate width direction.

The first transistor 101 and the second transistor 201 are formed in a semiconductor region 2A and a semiconductor region 2B, respectively. The semiconductor region 2A and the semiconductor region 2B are protruded regions formed on the semiconductor layer 1.

The semiconductor region 2A includes a first portion and a second portion that are spaced apart from each other, and a narrow portion 3a to serve as a channel region connecting the first portion and the second portion, the width of the narrow portion 3a in a second direction that is perpendicular to a first direction from the first portion to the second portion being narrower than the width in the second direction of each of the first portion and the second portion. FIG. 22(a) shows only one narrow portion 3a to serve as a channel region, but more than one narrow portion 3a can be formed.

The first transistor 101 includes a gate insulating film 5 that covers at least the top surface of the narrow portion 3a, a gate electrode 6 covering the gate insulating film 5, a source region 8 formed in the first portion, and a drain region 9 formed in the second portion. The gate insulating film 5 in this embodiment also covers the side surfaces of the channel region 3a as shown in FIG. 24(a).

Thus, the first transistor 101 includes the source region 8 and the drain region 9 that are spaced apart from each other in the semiconductor region 2A, and the channel region 3a connecting the source region 8 and the drain region 9, the width of the channel region 3a in the second direction perpendicular to the first direction from the source region 8 to the drain region 9 being narrower than the width of each of the source region 8 and the drain region 9 in the second direction. The side surfaces of the channel region 3a, the gate insulating film 5, the source region 8, and the drain region 9 are surrounded by a shallow trench isolation region 10. The channel region 3a has a plate-like structure (nanowire structure) having a width in the second direction, i.e., the length in the gate width direction, of approximately 1 nm to 25 nm, and a height from the top surface of the semiconductor layer 1 of approximately 1 nm to 50 nm. The first transistor 101 also includes gate sidewalls 7 of an insulating material on the side surfaces on the source region 8 side and on the drain region 9 side of the gate structure having the gate insulating film 5 and the gate electrode 6.

The width of the semiconductor region 2B is wider than that of the narrow portion 3a of the semiconductor region 2A. The second transistor 201 includes a source region 18 and a drain region 19 that are spaced apart from each other in the semiconductor region 2B, a gate insulating film 5a formed on the semiconductor region 2B in a region to serve as a channel region 4 between the source region 18 and the drain region 19, and a gate electrode 14a formed on the gate insulating film 5a. The width of the channel region 4 in a fourth direction (gate width direction) perpendicular to a third direction (gate length direction) from the source region 18 to the drain region 19 is substantially the same as the width of each of the source region 18 and the drain region 19 in the fourth direction. The length in the gate width direction (gate width) of the channel region 4 is 100 nm to 1 μm. Herein, the channel region 4 is also called "wide portion" as compared to the narrow portion 3 of the first transistor 101. In this embodiment, the gate insulating film 5a also covers the side surfaces of the channel region along the third direction from the source region 18 to the drain region 19, as shown in FIG. 24(b). The side surfaces of the channel region 4, the gate insulating film 5a, the source region 18, and the drain region 19 are surrounded by a shallow trench isolation region 20. The second transistor 201 also includes gate sidewalls 15 of an insulating material on the side surfaces on the source region 18 side and on the drain region 19 side of the gate structure including the gate insulating film 5a and the gate electrode 14a.

The narrow portion 3a of the semiconductor device according to the third embodiment having such a structure includes a large amount of impurity, and the wide channel region 4 includes a less amount of impurity.

In order to adjust the threshold value, an impurity is implanted into the narrow portion to serve as the nanowire of the semiconductor device according to the third embodiment. As can be understood from FIGS. 24(a) and 24(b), the impurity is also implanted into the region of the semiconductor layer 1 covered by the shallow trench isolation regions 10, 20.

The semiconductor layer 1 and the semiconductor regions 2A, 2B are formed of monocrystalline silicon, amorphous silicon, or polycrystalline silicon.

(Manufacturing Method)

A method of manufacturing the semiconductor device according to the third embodiment will be described below with reference to FIGS. 25(a) and 25(b).

First, the same processes as those shown in FIGS. 5(a) to 6(b) of the method of manufacturing the semiconductor device according to the first embodiment are performed. Then, dry etching is performed. At this time, the silicon nitride film on the narrow portion 3 is removed using the feature that the etching rate of the silicon nitride film 17 on the narrow portion 3 is faster than that of the silicon nitride film 17 on the wide portion 4 to serve as a channel region. The etching time is determined such that both the silicon nitride film on the first portion and the second portion of the semiconductor region 2A and the silicon nitride film on the semiconductor region 2B are left.

Thereafter, ions of impurity are implanted as shown in FIGS. 25(a) and 25(b). Examples of ion species of impurity include B (boron), As (arsenic), and P (phosphorus). Since no silicon nitride film is left on the narrow portion 3 of the semiconductor region 2A, the impurity is implanted into the narrow portion 3 to form a narrow portion 3a. However, since each of the regions to serve as the source and drain regions 8, 9 in the semiconductor region 2A is wider than the narrow portion 3, the silicon nitride film 17 have not been removed from these regions, and the impurity is not implanted into these regions. As can be understood from FIG. 6(b), the semiconductor region 2B is covered by the silicon nitride film 17, and thus the impurity is not implanted into the semiconductor region 2B. The impurity is also implanted into the regions other than the semiconductor region 2A and the semiconductor region 2B of the semiconductor layer 1.

Then, the silicon nitride film on the first portion and the second portion of the semiconductor region 2A and the silicon nitride film on the semiconductor region 2B are removed by selective etching using dry etching or wet etching. Subsequently, a shallow trench isolation region is formed by using the well-known techniques to form a gate electrode material film. In this embodiment, the insulating film 16 serves as the gate insulating films 5, 5a. An insulating film 22 may be formed before forming the gate electrode material film, as in the case of the first embodiment. In such a case, the insulating film 22 and the insulating film 16 serve as the gate insulating film. Thereafter, the gate electrode material film is patterned. Then, impurity ions are implanted into regions to serve as a source and a drain to form the source region and the drain region. Gate sidewalls are then formed to complete the semiconductor device according to the third embodiment. Thus, a transistor with a narrow portion to which the impurity is implanted and a transistor with a wide portion to which the impurity is not implanted into can be simultaneously formed by performing normal transistor-manufacturing processes.

The materials to form the gate insulating film, the gate electrode, and the gate sidewalls can be the same as those used in the first embodiment.

In the third embodiment, a normal planar transistor is formed in the narrow portion 3a by forming the shallow trench isolation region 10. However, the Tri-gate structure may be employed in which the side surfaces of the narrow portion 3a are oxidized without the shallow trench isolation region 10 being formed, then the gate electrode 6 is formed, thereby using the side surfaces of the narrow portion 3a as the channel.

The narrow portion 3 other than the channel region can be epitaxially grown in order to reduce the parasitic resistance.

According to this manufacturing method, the threshold value of the transistor formed in the narrow portion 3a can be made different from the threshold value of the transistor formed in the wide portion by implanting an impurity into the channel of the narrow portion 3a. Thus, according to the manufacturing method of the third embodiment, the transistors having different structures can be formed with a small number of processes.

Although the semiconductor layer 1 in the third embodiment is a bulk substrate, it can be an SOI layer of an SOI substrate.

The first transistor 101 in the third embodiment includes the channel region 3a having a width in the second direction being narrower than the width of each of the source region 8 and the drain region 9 in the second direction. However, if the width of the channel region 3 in the second direction is the same as the width of each of the source region 8 and the drain region 9 in the second direction, and narrower than the width of the channel region 4 of the second transistor 201 in the direction perpendicular to the direction from the source region 18 to the drain region 19, the same effect as that of the third embodiment can be obtained. In such a case, the silicon nitride film 17 on the first portion and the second portion of the semiconductor region 2A is removed when the silicon nitride film 17 on the narrow portion 3 is removed. However, the silicon nitride film on the first portion and the second portion of the semiconductor region 2A may be selectively left.

As described above, according to the respective embodiments, it is possible to provide a semiconductor device in which transistors with different structures can be formed by a small number of processes, and a method of manufacturing such a semiconductor device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device comprising:
   forming a first insulating film on a semiconductor layer;
   forming a first mask of a charge storing material and a second mask of a charge storing material on the first insulating film, the first mask including a first portion, a second portion, and a third portion extending in a first direction from the first portion to the second portion and connecting the first portion and the second portion, the third portion having a width in a second direction perpendicular to the first direction, and the second mask having a width in a third direction that is wider than the width of the third portion in the second direction, the first mask and the second mask being formed of the same material;
   forming a first semiconductor region having a protruded shape and a second semiconductor region having a protruded shape on the semiconductor layer by patterning the first insulating film and the semiconductor layer using the first mask and the second mask, the first semiconductor region including a fourth portion, a fifth portion, and a sixth portion connecting the fourth portion and the fifth portion, and the second semiconductor region having a width in the third direction that is wider than a width of the sixth portion in the second direction;

forming an element isolation insulating film between the first semiconductor region and the second semiconductor region;

performing selective etching so that the third portion of the first mask is removed but the second mask is left by using an etching rate difference between the third portion of the first mask and the second mask;

forming and patterning a second insulating film and a gate electrode material film, thereby forming a gate insulating film and a first gate electrode at least on a top surface of the sixth portion in the first semiconductor region, and forming a tunnel insulating film, a charge storage film, a block insulating film, and a second gate electrode on the second semiconductor region; and implanting an impurity into the first semiconductor region and the second semiconductor region using the first gate electrode and the second gate electrode as masks, thereby forming first source and drain regions in the fourth portion and the fifth portion of the first semiconductor region, and forming second source and drain regions in the second semiconductor region in a fourth direction perpendicular to the third direction.

2. The method according to claim 1, wherein the width of the third portion in the second direction is narrower than a width of each of the first portion and the second portion in the second direction, and the width of the six portion in the second direction is narrower than a width of each of the fourth portion and the fifth portion in the second direction.

3. The method according to claim 1, wherein the first mask and the second mask are formed of a material selected from the group consisting of silicon nitride, polycrystalline silicon, amorphous silicon, microcrystalline silicon, and hafnia.

4. The method according to claim 1, wherein the semiconductor layer is formed of a material selected from the group consisting of a monocrystalline semiconductor, a polycrystalline semiconductor, and an amorphous semiconductor.

5. A method of manufacturing a semiconductor device comprising:

patterning a semiconductor layer to form a first semiconductor region having a protruded shape and a second semiconductor region having a protruded shape in the semiconductor layer, the first semiconductor region including a first portion, a second portion, and a third portion extending in a first direction from the first portion to the second portion and connecting the first portion and the second portion, the third portion having a width in a second direction perpendicular to the first direction, and the second semiconductor region having a width in a third direction that is wider than the width of the third portion in the second direction;

forming a first insulating film at least on top surfaces of the first semiconductor region and the second semiconductor region;

forming an element isolation insulating film between the first semiconductor region and the second semiconductor region;

forming a charge storing material film covering the first semiconductor region, the second semiconductor region, the first insulating film, and the element isolation film;

selectively etching the charge storing material film to remove at least the charge storing material film on the third portion of the first semiconductor region and to leave the charge storing material film on the second semiconductor region by using an etching rate difference between the charge storing material film on the third portion of the first semiconductor region and the charge storing material film on the second semiconductor region;

forming and patterning a second insulating film and a gate electrode material film to form a gate insulating film and a first gate electrode at least on a top surface of the third portion in the first semiconductor region and to form a tunnel insulating film, a charge storage film, a block insulating film, and a second gate electrode on the second semiconductor region; and implanting an impurity into the first semiconductor region and the second semiconductor region using the first gate electrode and the second gate electrode as masks, thereby forming first source and drain regions in the first portion and the second portion of the first semiconductor region, and forming second source and drain regions in the second semiconductor region in a fourth direction perpendicular to the third direction.

6. The method according to claim 5, wherein the width of the third portion in the second direction is narrower than a width of each of the first portion and the second portion in the second direction.

7. The method according to claim 5, wherein the charge storing material film is formed of a material selected from the group consisting of silicon nitride, polycrystalline silicon, amorphous silicon, microcrystalline silicon, and hafnia.

8. The method according to claim 5, wherein the semiconductor layer is formed of a material selected from the group consisting of a monocrystalline semiconductor, a polycrystalline semiconductor, and an amorphous semiconductor.

9. A method of manufacturing a semiconductor device comprising:

forming a first insulating film on a semiconductor layer;

forming a first mask and a second mask of an insulating material on the first insulating film, the first mask including a first portion, a second portion, and a third portion extending in a first direction from the first portion to the second portion and connecting the first portion and the second portion, the third portion having a width in a second direction perpendicular to the first direction, and the second mask having a width in a third direction that is wider than the width of the third portion in the second direction;

patterning the first insulating film and the semiconductor layer using the first mask and the second mask to form a first semiconductor region having a protruded shape and a second semiconductor region having a protruded shape in the semiconductor layer, the first semiconductor region including a fourth portion, a fifth portion, and a sixth portion connecting the fourth portion and the fifth portion, a width of the second semiconductor region in the third direction being wider than a width of the sixth portion in the second direction;

performing selective etching to remove the first mask and to leave the second mask by using an etching rate difference between the first mask and the second mask;

implanting a first impurity into at least the sixth portion;

removing the second mask;

forming an element isolation insulating film between the first semiconductor region and the second semiconductor region;

forming a gate electrode material film;

patterning the gate electrode material film to form a first gate electrode and a second gate electrode in the first semiconductor region and the second semiconductor region, respectively; and implanting a second impurity into the first semiconductor region and the second semiconductor region using the first gate electrode and the second gate electrode as masks, thereby forming first source and drain regions in the fourth portion and the fifth portion of the first semiconductor region, and forming second source and drain regions in the second semiconductor region in a fourth direction perpendicular to the third direction.

10. The method according to claim 9, wherein the width of the third portion in the second direction is narrower than a width of each of the first portion and the second portion in the second direction, and the width of the six portion in the second direction is narrower than a width of each of the fourth portion and the fifth portion in the second direction.

11. The method according to claim 9, wherein the first impurity contains at least one element selected from P, As, and B.

12. The method according to claim 9, wherein the first mask and the second mask are formed of silicon nitride.

13. The method according to claim 9, wherein the semiconductor layer is formed of a material selected from the group consisting of a monocrystalline semiconductor, a polycrystalline semiconductor, and an amorphous semiconductor.

* * * * *